US009954096B2

(12) United States Patent
Fujiwara et al.

(10) Patent No.: US 9,954,096 B2
(45) Date of Patent: Apr. 24, 2018

(54) SWITCHING DEVICE AND METHOD OF MANUFACTURING THE SAME

(71) Applicant: TOYOTA JIDOSHA KABUSHIKI KAISHA, Toyota-shi, Aichi-ken (JP)

(72) Inventors: Hirokazu Fujiwara, Miyoshi (JP); Yuichi Takeuchi, Kariya (JP); Narumasa Soejima, Nagakute (JP)

(73) Assignee: TOYOTA JIDOSHA KABUSHIKI KAISHA, Toyota (JP)

( * ) Notice: Subject to any disclaimer, the term of this patent is extended or adjusted under 35 U.S.C. 154(b) by 0 days.

(21) Appl. No.: 15/664,379

(22) Filed: Jul. 31, 2017

(65) Prior Publication Data

US 2018/0090612 A1  Mar. 29, 2018

(30) Foreign Application Priority Data

Sep. 28, 2016 (JP) ................. 2016-190035

(51) Int. Cl.
*H01L 29/423* (2006.01)
*H01L 29/78* (2006.01)
*H01L 29/66* (2006.01)
*H01L 29/10* (2006.01)
*H01L 29/06* (2006.01)

(52) U.S. Cl.
CPC ...... *H01L 29/7813* (2013.01); *H01L 29/0615* (2013.01); *H01L 29/1095* (2013.01); *H01L 29/4236* (2013.01); *H01L 29/66704* (2013.01); *H01L 29/66734* (2013.01); *H01L 29/7825* (2013.01)

(58) Field of Classification Search
CPC ........... H01L 29/4236; H01L 29/66704; H01L 29/7813; H01L 29/7825; H01L 29/66734
See application file for complete search history.

(56) References Cited

U.S. PATENT DOCUMENTS

| 2008/0087951 | A1* | 4/2008 | Takaya ................ H01L 29/0623 257/334 |
| 2015/0129895 | A1 | 5/2015 | Takeuchi et al. |
| 2016/0013300 | A1* | 1/2016 | Hashimoto ......... H01L 29/7391 363/131 |

FOREIGN PATENT DOCUMENTS

JP  2013-258369 A  12/2013

* cited by examiner

Primary Examiner — Phat X Cao
(74) Attorney, Agent, or Firm — Oliff PLC

(57) ABSTRACT

A switching device includes a semiconductor substrate; a trench; a conductor layer extending in a longitudinal direction of the trench so as to be in contact with a bottom surface of the trench; a bottom insulating layer covering an upper surface of the conductor layer; a gate insulating layer covering a side surface of the trench; and a gate electrode disposed in the trench. The semiconductor substrate includes a first semiconductor region of a first conductivity type, a body region of a second conductivity type, a second semiconductor region of the first conductivity type, a bottom semiconductor region of the second conductivity type extending in the longitudinal direction so as to be in contact with the conductor layer, and a connection semiconductor region of the second conductivity type connected to the body region and to the bottom semiconductor region.

4 Claims, 14 Drawing Sheets

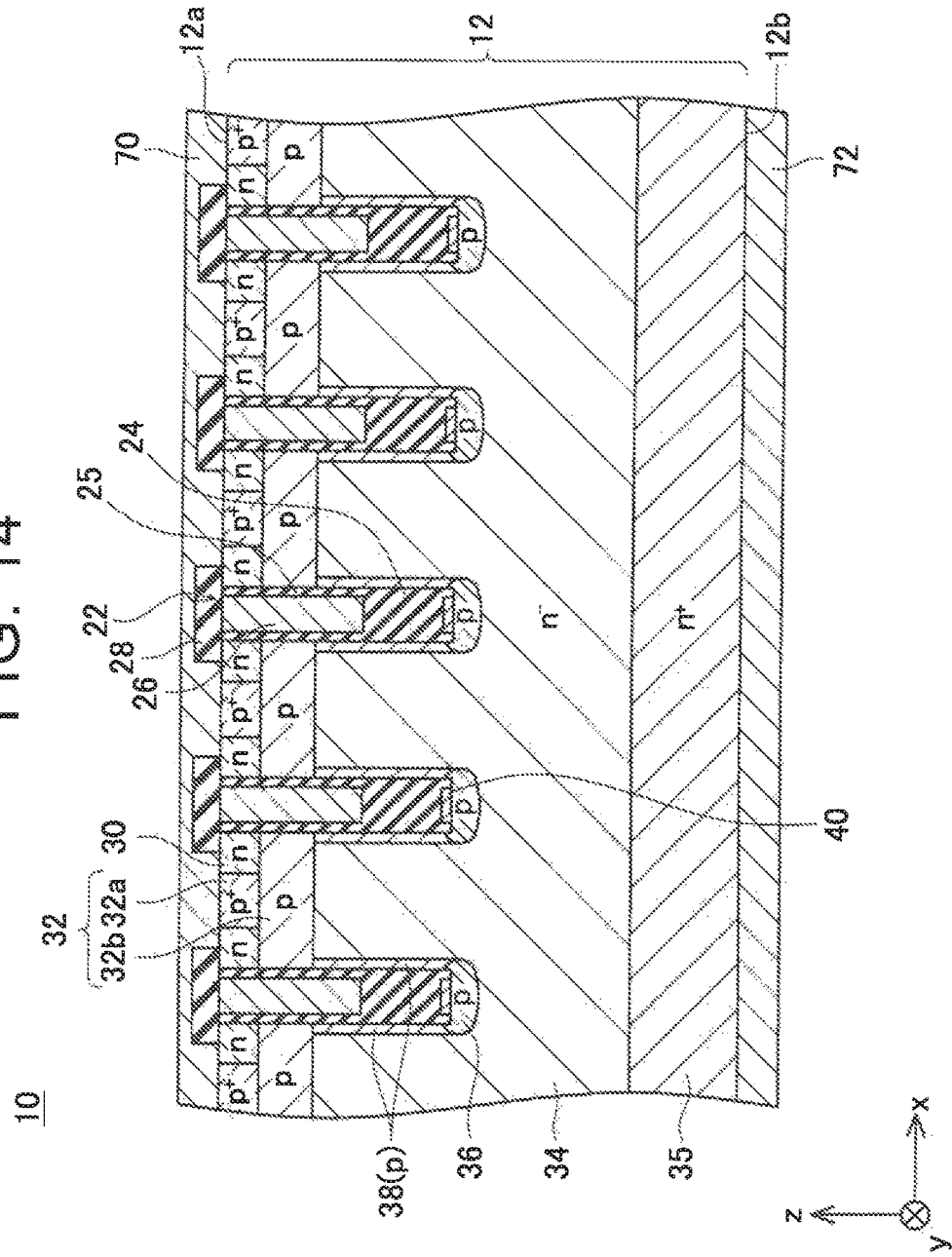

SWITCHING DEVICE AND METHOD OF MANUFACTURING THE SAME

INCORPORATION BY REFERENCE

The disclosure of Japanese Patent Application No. 2016-190035 filed on Sep. 28, 2016 including the specification, drawings and abstract is incorporated herein by reference in its entirety.

BACKGROUND

1. Technical Field

The technique disclosed in this specification relates to a switching device and a method of manufacturing the same.

2. Description of Related Art

Japanese Patent Application Publication No. 2013-258369 (JP 2013-258369 A) discloses a switching device including a gate electrode disposed in a trench. The switching device includes an n-type source region, a p-type body region, and an n-type drift region. The source region, the body region, and the drift region are in contact with a gate insulating layer at a side surface of the trench. Further, the switching device includes a p-type bottom semiconductor region that is in contact with a bottom surface of the trench. The bottom semiconductor region extends in a longitudinal direction of the trench. The switching device further includes a p-type connection semiconductor region extending along a part of the side surface of the trench. The connection semiconductor region is connected to the body region and the bottom semiconductor region.

When the switching device is turned off, a depletion layer extends from the bottom semiconductor region into the drift region. By the depletion layer, electric field concentration in the vicinity of the bottom semiconductor region (i.e., in the vicinity of the bottom of the trench) is suppressed.

When a predetermined potential is applied to the gate electrode, a channel is formed in the body region in the vicinity of the gate insulating layer. Consequently, main current flows from the drift region into the source region. That is, the switching device is turned on. When the switching device is turned on, charges are supplied from the body region to the bottom semiconductor region via the connection semiconductor region. When the charges are supplied to the bottom semiconductor region, the depletion layer extending from the bottom semiconductor region into the drift region contracts toward the bottom semiconductor region. Therefore, the resistance of the drift region is reduced when the switching device is turned on. Accordingly, main current can flow in the drift region with low loss.

When the switching device is on, main current does not flow in an area where the connection semiconductor region is provided. Therefore, in order to ensure a wide main current path, the connection semiconductor region is formed only at a part of the side surface of the trench.

SUMMARY

The bottom semiconductor region extends in the longitudinal direction of the trench. The connection semiconductor region is formed only at a part of the side surface of the trench. Therefore, a part of the bottom semiconductor region (hereinafter referred to as a "specific part") is disposed at a position distant from the connection semiconductor region. Accordingly, a relatively high resistance exists between the specific part of the bottom semiconductor region and the connection semiconductor region. Therefore, when the switching device is turned on, it takes time for charges, which are supplied from the connection semiconductor region to the bottom semiconductor region, to reach the specific part, and thus, contraction of a depletion layer around the specific part is delayed. As a result, the resistance of the drift region around the specific part is not easily lowered, and thus, loss at this portion becomes high.

Therefore, this specification provides a switching device in which loss is further reduced when the switching device is turned on.

A switching device disclosed in this specification includes a semiconductor substrate; a trench provided in an upper surface of the semiconductor substrate; a conductor layer extending in a longitudinal direction of the trench so as to be in contact with a bottom surface of the trench; a bottom insulating layer covering an upper surface of the conductor layer; a gate insulating layer covering a side surface of the trench above the bottom insulating layer; and a gate electrode disposed in the trench and insulated from the semiconductor substrate and the conductor layer by the bottom insulating layer and the gate insulating layer. The semiconductor substrate includes a first semiconductor region of a first conductivity type contacting the gate insulating layer, a body region of a second conductivity type contacting the gate insulating layer under the first semiconductor region, a second semiconductor region of the first conductivity type contacting the gate insulating layer under the body region and separated from the first semiconductor region by the body region, a bottom semiconductor region of the second conductivity type extending in the longitudinal direction of the trench so as to be in contact with the conductor layer and contacting the second semiconductor region, and a connection semiconductor region of the second conductivity type extending along a part of the side surface of the trench and connected to the body region and to the bottom semiconductor region.

One of the first conductivity type and the second conductivity type is an n-type and the other is a p-type.

The switching device includes the conductor layer extending in the longitudinal direction of the trench so as to be in contact with the bottom surface of the trench. Further, the bottom semiconductor region extends in the longitudinal direction of the trench so as to be in contact with the conductor layer. Since the resistance of the conductor layer is low, charges that are supplied from the connection semiconductor region when the switching device is turned on can move at high speed in the longitudinal direction of the trench via the conductor layer. Therefore, the charges supplied from the connection semiconductor region can reach the above-described specific part (i.e., a part of the bottom semiconductor region, the part being distant from the connection semiconductor region) in a short time. That is, the charges are supplied to the entire bottom semiconductor region in a short time. Accordingly, a depletion layer contracts at high speed around the entire bottom semiconductor region, and thus, the resistance of the second semiconductor region is reduced in a short time around the entire bottom semiconductor region. Therefore, loss at the time when the switching device is turned on is suppressed.

Further, the specification provides a method of manufacturing a switching device. The manufacturing method includes forming a trench in an upper surface of a semiconductor substrate; forming a protective film covering a side surface of the trench such that a bottom surface of the trench is exposed; forming a metal layer covering the protective film and the bottom surface of the trench; heating the metal layer to form a conductor layer by alloying the metal layer and the bottom surface of the trench with each other; removing, by etching, the metal layer covering the protective film such that the conductor layer remains; and completing a switching device using the conductor layer and the trench. The switching device includes a bottom insulating layer covering an upper surface of the conductor layer, a gate insulating layer covering the side surface of the trench above the bottom insulating layer, a gate electrode disposed in the trench and insulated from the semiconductor substrate and the conductor layer by the bottom insulating layer and the gate insulating layer, a first semiconductor region of a first conductivity type contacting the gate insulating layer, a body region of a second conductivity type contacting the gate insulating layer under the first semiconductor region, a second semiconductor region of the first conductivity type contacting the gate insulating layer under the body region and separated from the first semiconductor region by the body region, a bottom semiconductor region of the second conductivity type extending in a longitudinal direction of the trench so as to be in contact with the conductor layer and contacting the second semiconductor region, and a connection semiconductor region of the second conductivity type extending along a part of the side surface of the trench and connected to the body region and to the bottom semiconductor region.

A part of the process of completing the switching device (e.g., formation of the semiconductor regions such as the first semiconductor region and the body region) may be carried out at any timing before the metal layer is etched (e.g., before the trench is formed).

In the manufacturing method, the metal layer is formed such that the metal layer and the semiconductor substrate are in contact with each other at the bottom surface of the trench and the protective film and the metal layer are in contact with each other at the side surface of the trench. Thereafter, when the metal layer is heated, the metal layer and the bottom surface of the trench (i.e., a semiconductor material forming the semiconductor substrate) are alloyed with each other at the bottom surface of the trench. As a result, the conductor layer is formed at the bottom of the trench. At the side surface of the trench, the metal layer is not in contact with the semiconductor substrate, and thus, an alloy is not formed. Thereafter, by removing the metal layer that has not been alloyed, the conductor layer remains at the bottom of the trench. According to this method, it is possible to easily form the conductor layer at the bottom of the trench.

BRIEF DESCRIPTION OF THE DRAWINGS

Features, advantages, and technical and industrial significance of exemplary embodiments of the disclosure will be described below with reference to the accompanying drawings, in which like numerals denote like elements, and wherein:

FIG. 14 is a sectional view taken along line XIV-XIV of FIG. 13.

DETAILED DESCRIPTION OF EMBODIMENTS

Figure 1:
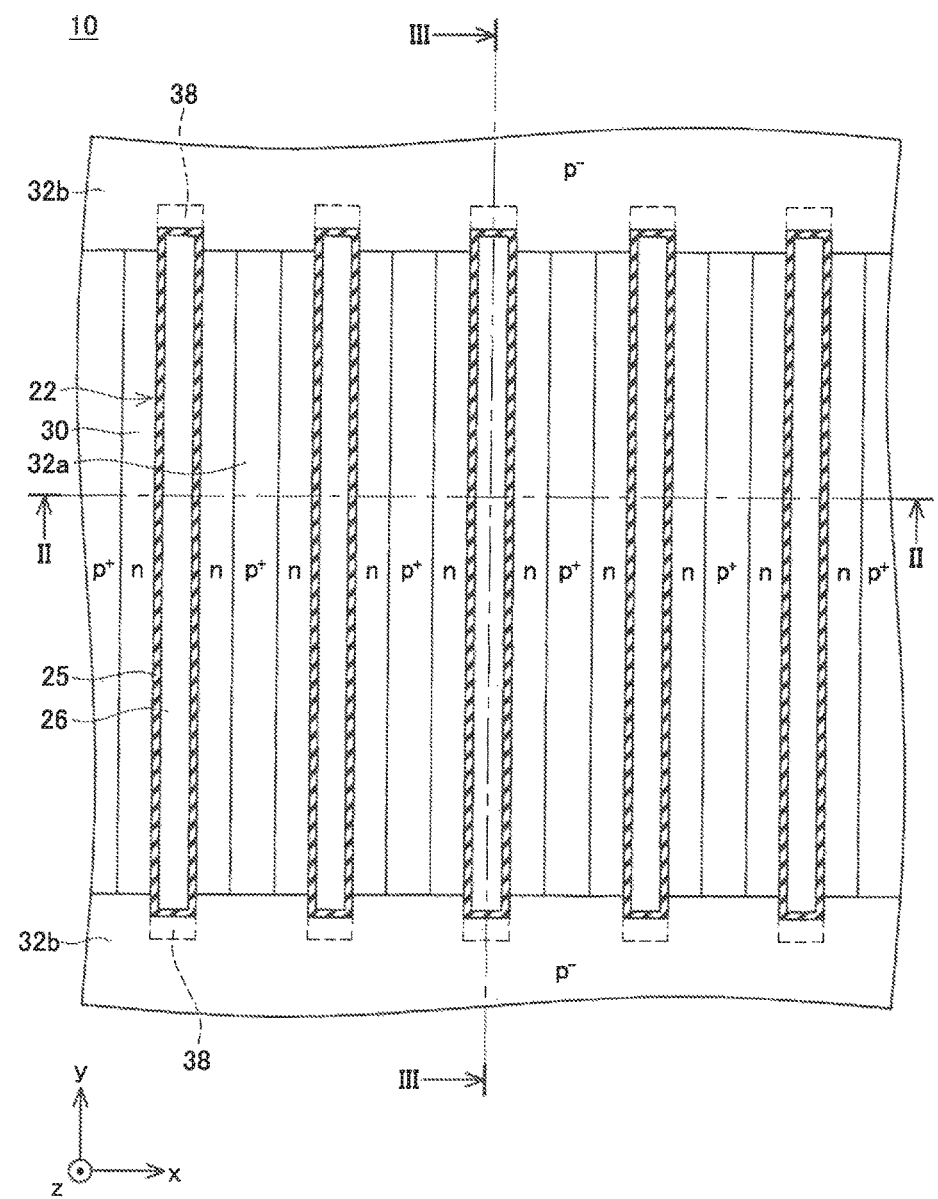
FIG. 1 is a plan view of a MOSFET according to an embodiment.
Figure 2:
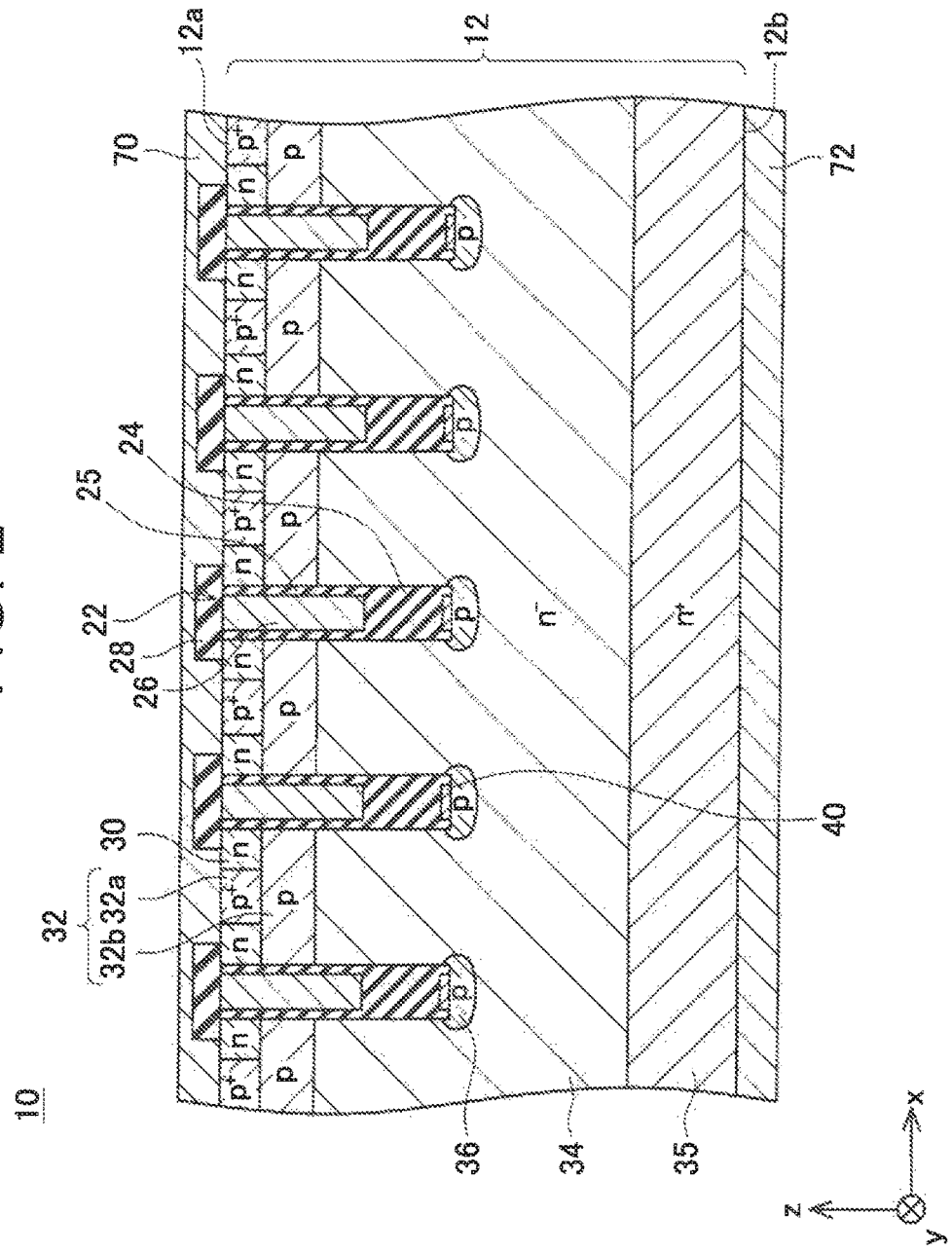
FIG. 2 is a sectional view taken along line II-II of FIG. 1.
Figure 3:
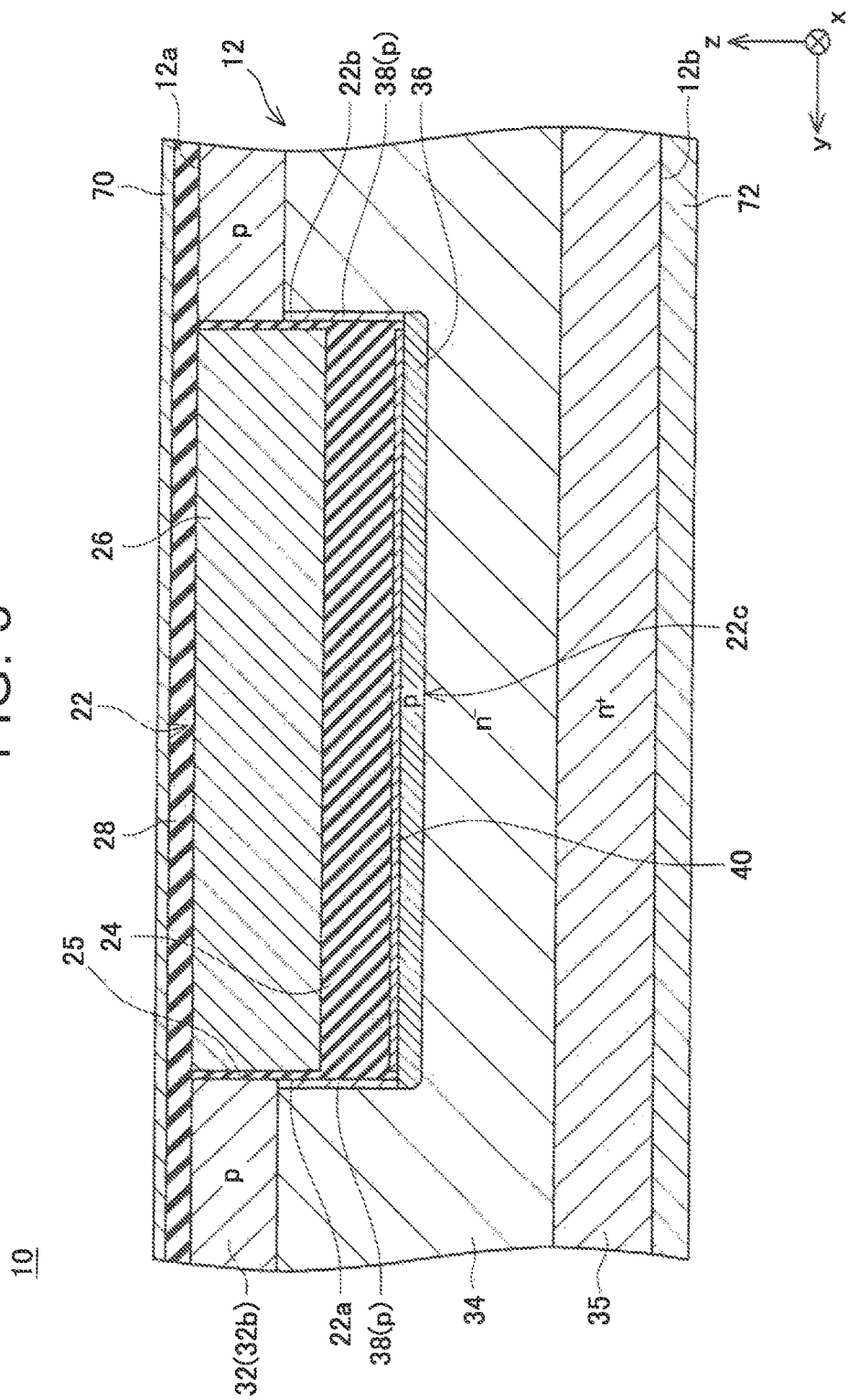
FIG. 3 is a sectional view taken along line III-III of FIG. 1.

FIGS. 1 to 3 show a metal-oxide semiconductor field-effect transistor (MOSFET) 10 according to an embodiment. As shown in FIGS. 2 and 3, the MOSFET 10 includes a semiconductor substrate 12, electrodes, insulating layers, and so on. In FIG. 1, illustration of the electrode and the insulating layer on an upper surface 12a of the semiconductor substrate 12 is omitted for better visibility. Hereinbelow, one direction parallel to the upper surface 12a of the semiconductor substrate 12 will be referred to as an x-direction, a direction parallel to the upper surface 12a and orthogonal to the x-direction will be referred to as a y-direction, and a thickness direction of the semiconductor substrate 12 will be referred to as a z-direction.

The semiconductor substrate 12 is made of SiC. As shown in FIG. 2, a plurality of trenches 22 is provided in the upper surface 12a of the semiconductor substrate 12. As shown in FIG. 1, each trench 22 extends long and straight in the y-direction. The trenches 22 are disposed at intervals in the x-direction. As shown in FIGS. 2 and 3, a conductor layer 40, a bottom insulating layer 24, a gate insulating layer 25, and a gate electrode 26 are disposed in each trench 22.

As shown in FIGS. 2 and 3, the conductor layer 40 is provided on a bottom surface of the trench 22. The conductor layer 40 is in contact with the bottom surface of the trench 22. As shown in FIG. 3, the conductor layer 40 extends long in a longitudinal direction of the trench 22 (i.e., the y-direction). In the longitudinal direction of the trench 22, the conductor layer 40 extends from a position near one end 22a of the trench 22 to a position near the other end 22b. The conductor layer 40 is made of a metal compound (e.g., nickel silicide).

The bottom insulating layer 24 is disposed at the bottom of the trench 22. The bottom insulating layer 24 covers an upper surface of the conductor layer 40. The bottom insulating layer 24 covers a side surface of the trench 22 in the vicinity of the bottom surface of the trench 22. The bottom insulating layer 24 is formed to be thick in a depth direction of the trench 22. The bottom insulating layer 24 is made of silicon oxide.

The gate insulating layer 25 covers the side surface of the trench 22 located above the bottom insulating layer 24. The gate insulating layer 25 is made of silicon oxide.

The gate electrode 26 is disposed on an upper portion of the bottom insulating layer 24. That is, an insulating layer between the gate electrode 26 and the bottom surface of the trench 22 is the bottom insulating layer 24, while an insulating layer between the gate electrode 26 and the side surface of the trench 22 is the gate insulating layer 25. The gate electrode 26 is insulated from the semiconductor substrate 12 by the gate insulating layer 25 and the bottom insulating layer 24. Further, the gate electrode 26 is insulated from the conductor layer 40 by the gate insulating layer 25 and the bottom insulating layer 24. An upper surface of each gate electrode 26 is covered with an interlayer insulating film 28.

The thickness of the gate insulating layer 25 (i.e., the interval between the side surface of the trench 22 and a side surface of the gate electrode 26) is smaller than the thickness of the bottom insulating layer 24 (i.e., the width between an upper surface and a lower surface of the bottom insulating layer 24 (in other words, the interval between a lower end of the gate electrode 26 and the bottom surface of the trench 22)).

An upper electrode 70 is disposed on the upper surface 12a of the semiconductor substrate 12. The upper electrode 70 is in contact with the upper surface 12a of the semiconductor substrate 12 at portions where the interlayer insulating film 28 is not provided. The upper electrode 70 is insulated from the gate electrodes 26 by the interlayer insulating films 28. A lower electrode 72 is disposed on a lower surface 12b of the semiconductor substrate 12. The lower electrode 72 is in contact with the lower surface 12b of the semiconductor substrate 12.

As shown in FIGS. 1 to 3, a plurality of source regions 30, a body region 32, a drift region 34, a drain region 35, a plurality of bottom semiconductor regions 36, and a plurality of connection semiconductor regions 38 are provided in the semiconductor substrate 12.

Each of the source regions 30 is an n-type region. As shown in FIGS. 1 and 2, the source regions 30 are exposed at the upper surface 12a of the semiconductor substrate 12 and are in ohmic contact with the upper electrode 70. The source regions 30 are in contact with the gate insulating layers 25 at the side surfaces of the trenches 22 in a short-side direction thereof (i.e., the side surfaces of the trenches 22, which are located at ends in the short-side direction and extend in the y-direction). The source regions 30 are in contact with the gate insulating layers 25 at upper end portions of the trenches 22.

The body region 32 is a p-type region. The body region 32 is in contact with the source regions 30. The body region 32 extends from areas each of which is sandwiched between the two source regions 30, to under the source regions 30. The body region 32 includes a low-concentration region 32b and a plurality of high-concentration regions 32a. The high-concentration regions 32a have a higher p-type impurity concentration than that of the low-concentration region 32b. Each high-concentration region 32a is disposed in the area sandwiched between the two source regions 30. The high-concentration regions 32a are in ohmic contact with the upper electrode 70. The low-concentration region 32b is disposed under the high-concentration regions 32a and the source regions 30. The low-concentration region 32b is in contact with the gate insulating layers 25 at the side surfaces of the trenches 22 in the short-side direction thereof. That is, the low-concentration region 32b is in contact with the gate insulating layers 25, under the source regions 30. As shown in FIGS. 1 and 3, the low-concentration region 32b is disposed also in areas adjacent to the side surfaces of the trenches 22 in the longitudinal direction thereof (i.e., in the areas adjacent to the side surfaces that are located at ends of the trenches 22 in the longitudinal direction thereof and extend in the x-direction). The low-concentration region 32b is in contact with the gate insulating layers 25 at the side surfaces of the trenches 22 in the longitudinal direction. A lower end of the body region 32 (i.e., a lower end of the low-concentration region 32b) is located at a position higher than the lower ends of the gate electrodes 26 (i.e., the upper surfaces of the bottom insulating layers 24).

The drift region 34 is an n-type region. The drift region 34 is disposed under the body region 32 and separated from the source regions 30 by the body region 32. The drift region 34 is in contact with the gate insulating layers 25 and the bottom insulating layers 24 at the side surfaces of the trenches 22 in the short-side direction. That is, the drift region 34 is in contact with the gate insulating layers 25 and the bottom insulating layers 24, under the body region 32.

The drain region 35 is an n-type region. The drain region 35 has a higher n-type impurity concentration than that of the drift region 34. The drain region 35 is disposed under the drift region 34. The drain region 35 is exposed at the lower surface 12b of the semiconductor substrate 12. The drain region 35 is in ohmic contact with the lower electrode 72.

Each of the bottom semiconductor regions 36 is a p-type region. Each bottom semiconductor region 36 is disposed in an area exposed at the bottom surface of the corresponding trench 22. Each bottom semiconductor region 36 is in contact with the conductor layer 40 at the bottom surface of the corresponding trench 22. As shown in FIG. 3, each bottom semiconductor region 36 extends long in the y-direction along the bottom surface of the corresponding trench 22. Each bottom semiconductor region 36 extends from the one end 22a to the other end 22b of the corresponding trench 22. As shown in FIG. 2, the bottom semiconductor regions 36 are surrounded by the drift region 34. Except at portions where the later-described connection semiconductor regions 38 are formed, the bottom semiconductor regions 36 are separated from the body region 32 by the drift region 34. The bottom semiconductor regions 36 are separated from each other by the drift region 34.

As shown in FIGS. 1 and 3, each connection semiconductor region 38 is disposed in an area exposed at the side surface of the corresponding trench 22 in the longitudinal direction. Each connection semiconductor region 38 extends long in the z-direction along the side surface of the corresponding trench 22 in the longitudinal direction. As shown in FIG. 3, lower ends of the connection semiconductor regions 38 are connected to the bottom semiconductor region 36, while upper ends of the connection semiconductor regions 38 are connected to the body region 32 (the low-concentration region 32b). That is, the connection semiconductor regions 38 are connected to the body region 32 and to the bottom semiconductor region 36. In the specification, a part extending long from the body region 32 to the bottom semiconductor region 36 along the side surface of the trench 22 is referred to as the connection semiconductor region 38. That is, the p-type region distributed in the horizontal directions along the upper surface 12a of the semiconductor substrate 12 is the body region 32, and a part protruding downward from the body region 32 along the side surface of the trench 22 is the connection semiconductor region 38. As shown in FIG. 3, each connection semiconductor region 38 is in contact with the gate insulating layer 25 and the bottom insulating layer 24 at the side surface of the corresponding trench 22 in the longitudinal direction. The p-type impurity concentration of the connection semiconductor regions 38 is lower than that of the bottom semiconductor regions 36.

Next, the operation of the MOSFET 10 will be described. When the MOSFET 10 is used, the MOSFET 10, a load (e.g., a motor), and a power supply are connected in series. A power supply voltage (approximately 800V in this embodiment) is applied to a series circuit of the MOSFET 10 and the load. The power supply voltage is applied in a direction such that the drain side (the lower electrode 72) becomes higher in potential than the source side (the upper electrode 70) in the MOSFET 10. When a gate-on potential (a potential higher than a gate threshold) is applied to the gate electrodes 26, channels (inversion layers) are formed in the body region 32 (the low-concentration region 32*b*) at areas contacting the gate insulating layers 25, so that the MOSFET 10 is turned on. When a gate-off potential (a potential lower than or equal to the gate threshold) is applied to the gate electrodes 26, the channels disappear so that the MOSFET 10 is turned off. Hereinbelow, operations of the MOSFET 10 when it turns off and turns on will be described in detail. Hereinbelow, for convenience of description, although holes are not present in a conductor, when charges corresponding to holes flow between a semiconductor and a conductor, the flow of the charges corresponding to the holes in the conductor may be referred to as the flow of the holes in the conductor.

When the MOSFET 10 is turned off, the potential of the gate electrodes 26 is reduced from the gate-on potential to the gate-off potential. Then, the channels disappear, and the potential of the lower electrode 72 increases. The potential of the lower electrode 72 increases to a potential that is higher than that of the upper electrode 70 by the power supply voltage (i.e., approximately 800V). In the process where the potential of the lower electrode 72 increases, the potential of the bottom semiconductor regions 36 slightly increases due to capacitive coupling between the bottom semiconductor regions 36 and the lower electrode 72. Then, holes flow from the bottom semiconductor regions 36 into the upper electrode 70 via the conductor layers 40, the connection semiconductor regions 38, and the body region 32. More specifically, holes in each bottom semiconductor region 36 flow in the bottom semiconductor region 36 and the conductor layer 40 in the longitudinal direction of the trench 22. Since the bottom semiconductor region 36 is in contact with the conductor layer 40 and since the resistance of the conductor layer 40 is much less than that of the bottom semiconductor region 36, the holes flow in the longitudinal direction of the trench 22 mainly through the inside of the conductor layer 40. Since the resistance of the conductor layer 40 is extremely low, the holes flow at high speed in the conductor layer 40 in the longitudinal direction of the trench 22. The holes that have flowed to the end 22*a* or 22*b* of the trench 22 along the conductor layer 40 and the bottom semiconductor region 36 flow into the upper electrode 70 via the connection semiconductor region 38 and the body region 32. While the holes are flowing in this way, the increase in the potential of the bottom semiconductor region 36 is suppressed such that the potential of the bottom semiconductor region 36 is maintained to be slightly higher than that of the upper electrode 70. Since the holes can flow at high speed in the longitudinal direction of the trench 22 by the conductor layer 40, the holes are discharged in a short time even from a part of the bottom semiconductor region 36, the part being far from the connection semiconductor region 38 (i.e., a part of the bottom semiconductor region 36, the part being located at a middle portion 22*c* in the longitudinal direction of the trench 22 (see FIG. 3)). Therefore, the increase in potential is effectively suppressed even at the part located at the middle portion 22*c*.

With the increase in the potential of the lower electrode 72, the potentials of the drain region 35 and the drift region 34 also increase. When the potential of the drift region 34 is increased, a potential difference occurs between the body region 32 and the drift region 34. Therefore, a reverse voltage is applied to a p-n junction at an interface between the body region 32 and the drift region 34. Accordingly, a depletion layer extends from the body region 32 into the drift region 34. In addition, when the potential of the drift region 34 is increased, a potential difference occurs between the bottom semiconductor regions 36 and the drift region 34. Therefore, a reverse voltage is applied to a p-n junction at an interface between each of the bottom semiconductor regions 36 and the drift region 34. Accordingly, a depletion layer extends from each of the bottom semiconductor regions 36 into the drift region 34. By the depletion layers extending into the drift region 34 in this way, electric field concentration in the drift region 34 is suppressed. In particular, by the depletion layers extending from the bottom semiconductor regions 36, electric field concentration in the vicinity of the bottom surfaces of the trenches 22 is suppressed.

Further, when the potential of the drift region 34 is increased, a reverse voltage is applied also to a p-n junction at an interface between each of the connection semiconductor regions 38 and the drift region 34. Since the p-type impurity concentration of the connection semiconductor regions 38 is low, a depletion layer extends widely into each of the connection semiconductor regions 38 from the p-n junction. Consequently, the connection semiconductor regions 38 are depleted. By the depletion of the connection semiconductor regions 38, the bottom semiconductor regions 36 are electrically separated from the upper electrode 70.

When the bottom semiconductor regions 36 are electrically separated from the body region 32, the flow of holes from the bottom semiconductor regions 36 toward the upper electrode 70 is stopped, so that the potential of the bottom semiconductor regions 36 is floating. Therefore, the potential of the bottom semiconductor regions 36 increases with the increase in the potential of the lower electrode 72. Since the potential of the bottom semiconductor regions 36 increases to a certain degree, the potential difference between the bottom semiconductor regions 36 and the lower electrode 72 is prevented from becoming excessively large. When the potential of the lower electrode 72 is increased to the potential that is higher than that of the upper electrode 70 by the power supply voltage, the turn-off of the MOSFET 10 is completed.

When the MOSFET 10 is turned on, the potential of the gate electrodes 26 is increased from the gate-off potential to the gate-on potential. Then, in the body region 32 (the low-concentration region 32*b*), electrons are attracted to areas contacting the gate insulating layers 25 at the side surfaces of the trenches 22 in the short-side direction. Accordingly, the areas in the body region 32 are inverted from p-type to n-type, and thus, channels are formed. By these channels, the source regions 30 and the drift region 34 are connected to each other. As a result, the potentials of the drift region 34, the drain region 35, and the lower electrode 72 are lowered. When the potential of the drift region 34 is lowered, the reverse voltage applied to the p-n junction at the interface between the body region 32 and the drift region 34 is reduced. Therefore, the depletion layer extending from the body region 32 into the drift region 34 contracts toward the body region 32. Consequently, electrons flow from the upper electrode 70 into the lower electrode 72 via the source regions 30, the channels, the drift region 34, and the drain region 35. That is, the MOSFET 10 is turned on.

In the process where the potential of the drift region 34 is lowered, the depletion layers extending widely into the connection semiconductor regions 38 contract toward the drift region 34 so as to substantially disappear. As a result, the bottom semiconductor regions 36 are electrically connected to the body region 32. Then, holes flow from the upper electrode 70 into the bottom semiconductor regions 36 via the body region 32, the connection semiconductor regions 38, and the conductor layers 40. More specifically, holes flow from the upper electrode 70 into each conductor layer 40 and each bottom semiconductor region 36 via the body region 32 and the connection semiconductor regions 38. Since the resistance of the conductor layer 40 is much lower than that of the bottom semiconductor region 36, the holes flow in the longitudinal direction of the trench 22 mainly through the inside of the conductor layer 40. The holes are supplied to the entire bottom semiconductor region 36 via the conductor layer 40. When the holes are supplied to the bottom semiconductor region 36, the depletion layer extending from the bottom semiconductor region 36 into the drift region 34 contracts toward the bottom semiconductor region 36. Therefore, the resistance of the drift region 34 is reduced, and thus, electrons easily flow from the upper electrode 70 toward the lower electrode 72. Accordingly, loss hardly occurs in the drift region 34. In particular, in this embodiment, since the resistance of the conductor layer 40 is extremely low, the holes can flow in the conductor layer 40 at high speed in the longitudinal direction of the trench 22. Therefore, the holes are supplied in a short time even to a part of the bottom semiconductor region 36, the part being far from the connection semiconductor region 38 (i.e., a part of the bottom semiconductor region 36, the part being located at the middle portion 22c). Accordingly, the holes are supplied to the entire bottom semiconductor region 36 in a short time. As a result, the depletion layer extending into the drift region 34 can be contracted at high speed around the entire bottom semiconductor region 36. Therefore, in the MOSFET 10, the resistance of the drift region 34 is reduced in a short time after the potential of the gate electrodes 26 is increased to the gate-on potential. That is, the on-resistance of the MOSFET 10 is reduced in a short time when the MOSFET 10 is turned on. Consequently, loss hardly occurs in the MOSFET 10.

As described above, in the MOSFET 10, when the MOSFET 10 is turned on, the holes are supplied to the entire bottom semiconductor regions 36 in a short time via the conductor layers 40. Therefore, the depletion layers extending from the bottom semiconductor regions 36 into the drift region 34 can be contracted in a short time around the entire bottom semiconductor regions 36. Consequently, loss hardly occurs in the MOSFET 10 when the MOSFET 10 is turned on.

Figure 4:
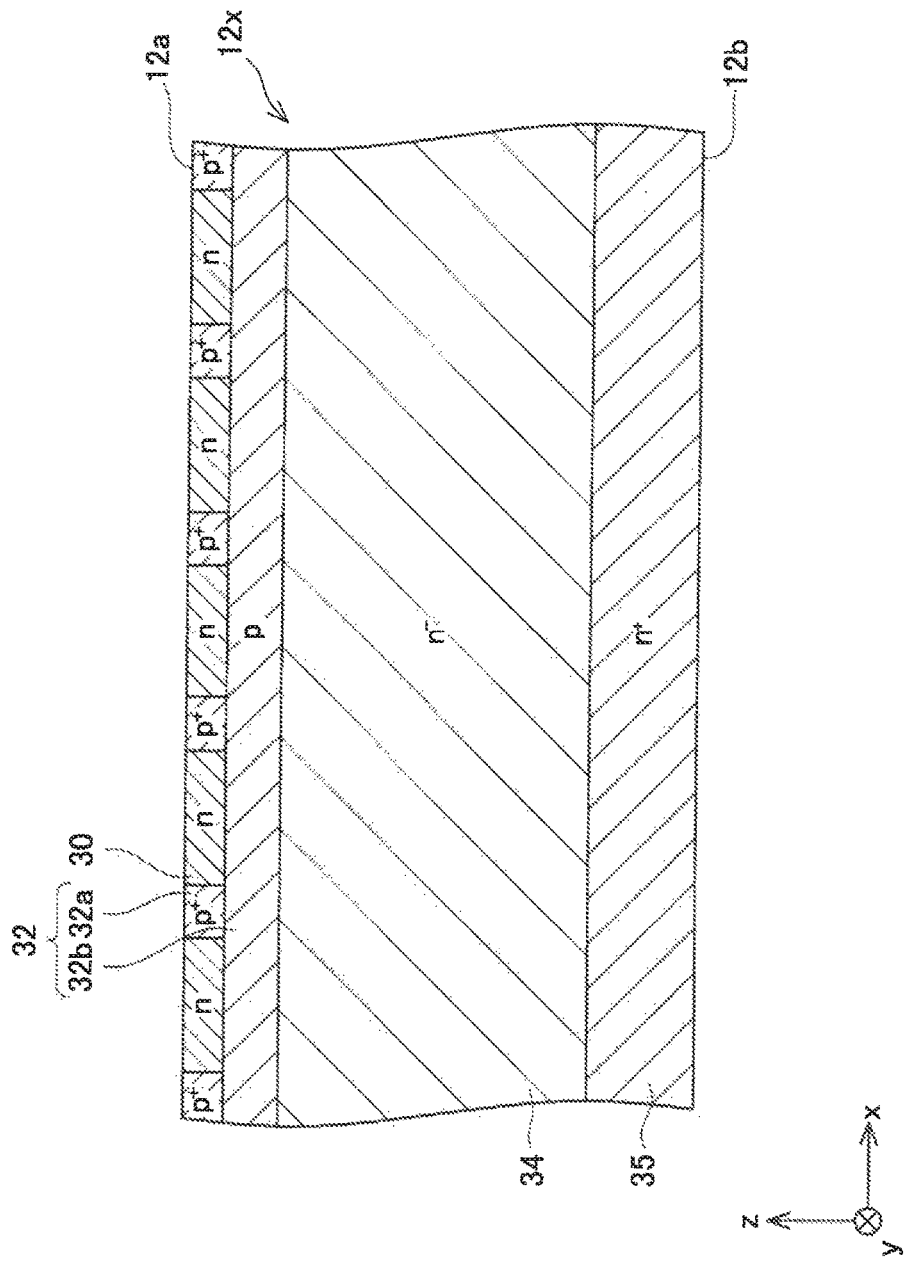
FIG. 4 is a sectional view of a semiconductor substrate before trenches are formed.

Next, a method of manufacturing the MOSFET 10 will be described. First, as shown in FIG. 4, a semiconductor substrate 12x (a semiconductor substrate as a material of the MOSFET 10) including the drain region 35, the drift region 34, the body region 32, and the source regions 30 is prepared. The semiconductor substrate 12x is made of SiC. The drift region 34 is a region formed on the drain region 35 by epitaxial growth. The body region 32 and the source regions 30 are regions formed by epitaxial growth or ion implantation.

Figure 5:
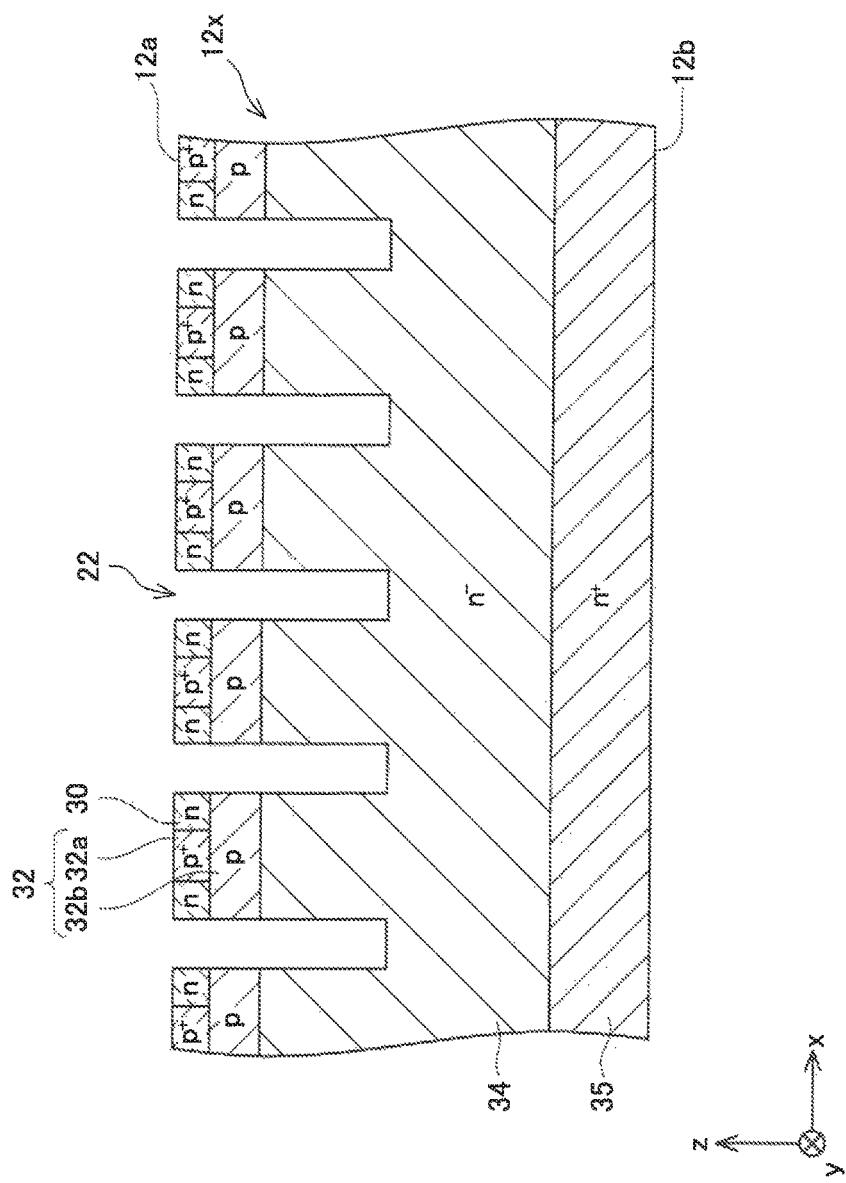
FIG. 5 is a sectional view of the semiconductor substrate after the trenches are formed.

Then, as shown in FIG. 5, a plurality of trenches 22 is formed by partially etching the upper surface 12a of the semiconductor substrate 12x. Each of the trenches 22 is formed to extend through the source region 30 and the body region 32 so as to reach the drift region 34.

Figure 6:
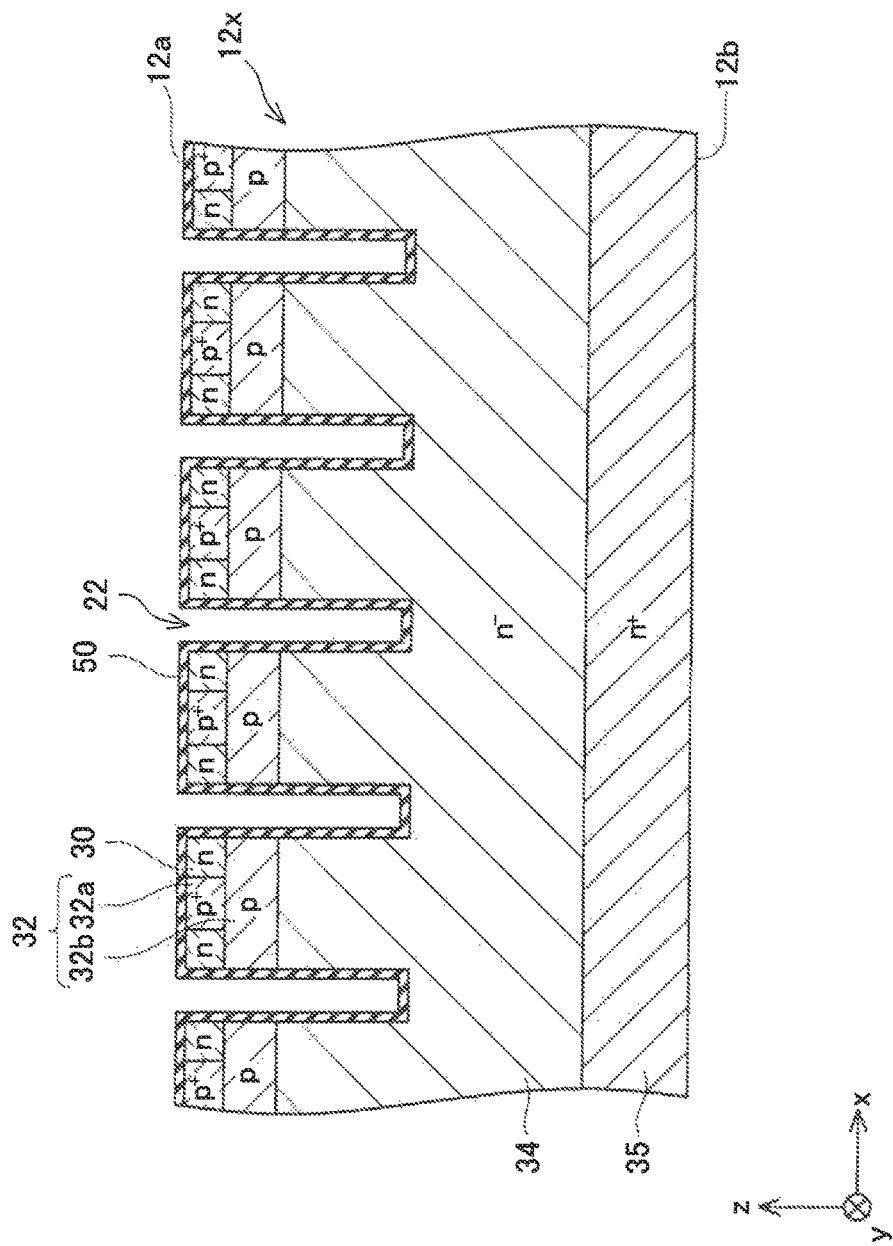
FIG. 6 is a sectional view of the semiconductor substrate after an oxide film is formed.

Then, as shown in FIG. 6, a thin oxide film 50 is formed on the upper surface 12a of the semiconductor substrate 12x and on inner surfaces (i.e., bottom surfaces and side surfaces) of the trenches 22. The oxide film 50 is made of silicon oxide and thus has insulation. The oxide film 50 can be formed by oxidizing the surface of the semiconductor substrate 12x.

Figure 7:
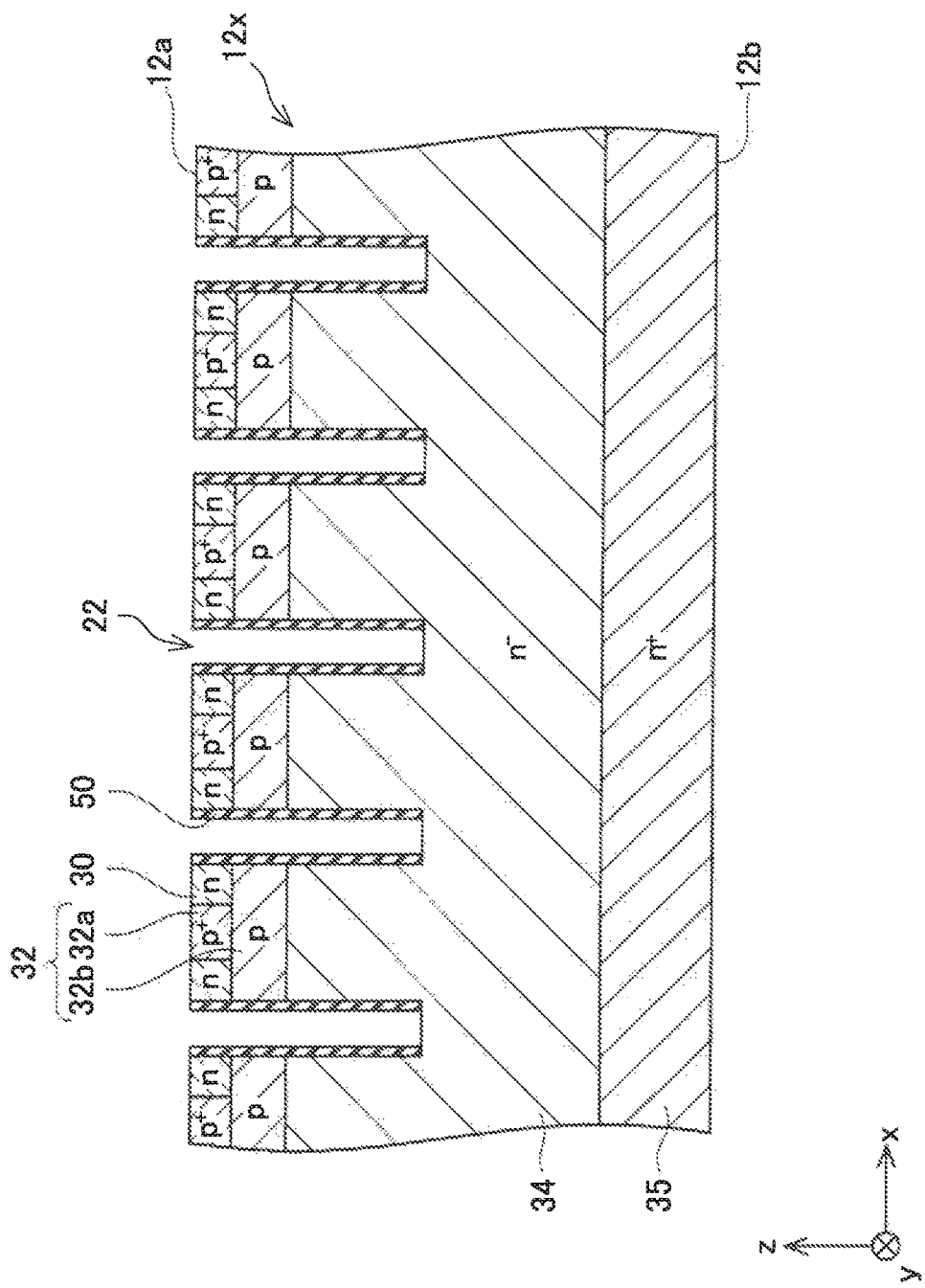
FIG. 7 is a sectional view of the semiconductor substrate after the oxide film is etched.

Then, as shown in FIG. 7, the oxide film 50 on the upper surface 12a of the semiconductor substrate 12x and on the bottom surfaces of the trenches 22 is removed by anisotropic dry etching. The oxide film 50 is left on the side surfaces of the trenches 22.

Figure 8:
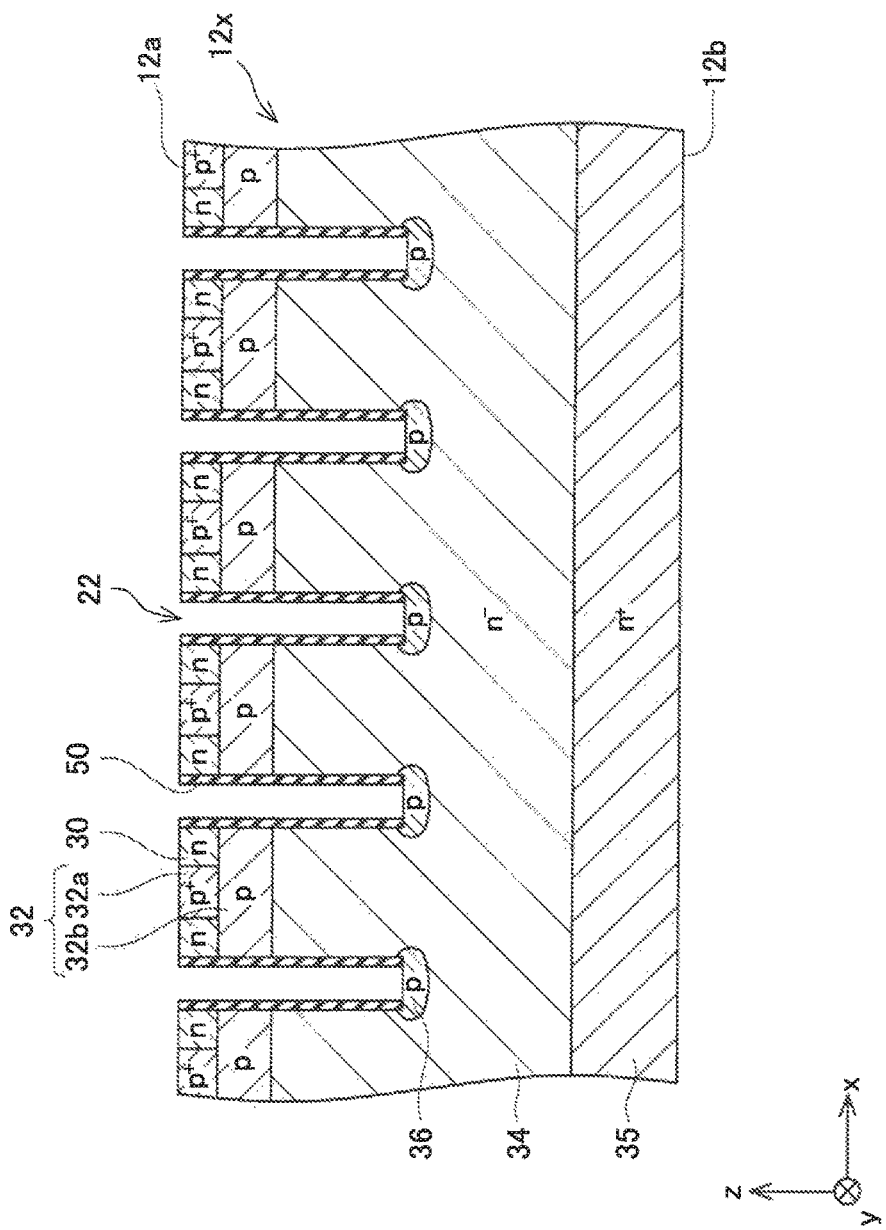
FIG. 8 is a sectional view of the semiconductor substrate after bottom semiconductor regions are formed.

Then, as shown in FIG. 8, bottom semiconductor regions 36 are formed by implanting aluminum ions into the bottom surfaces of the trenches 22. Further, connection semiconductor regions 38 are formed by implanting aluminum ions into the side surfaces of the trenches 22 in the longitudinal direction.

Figure 9:
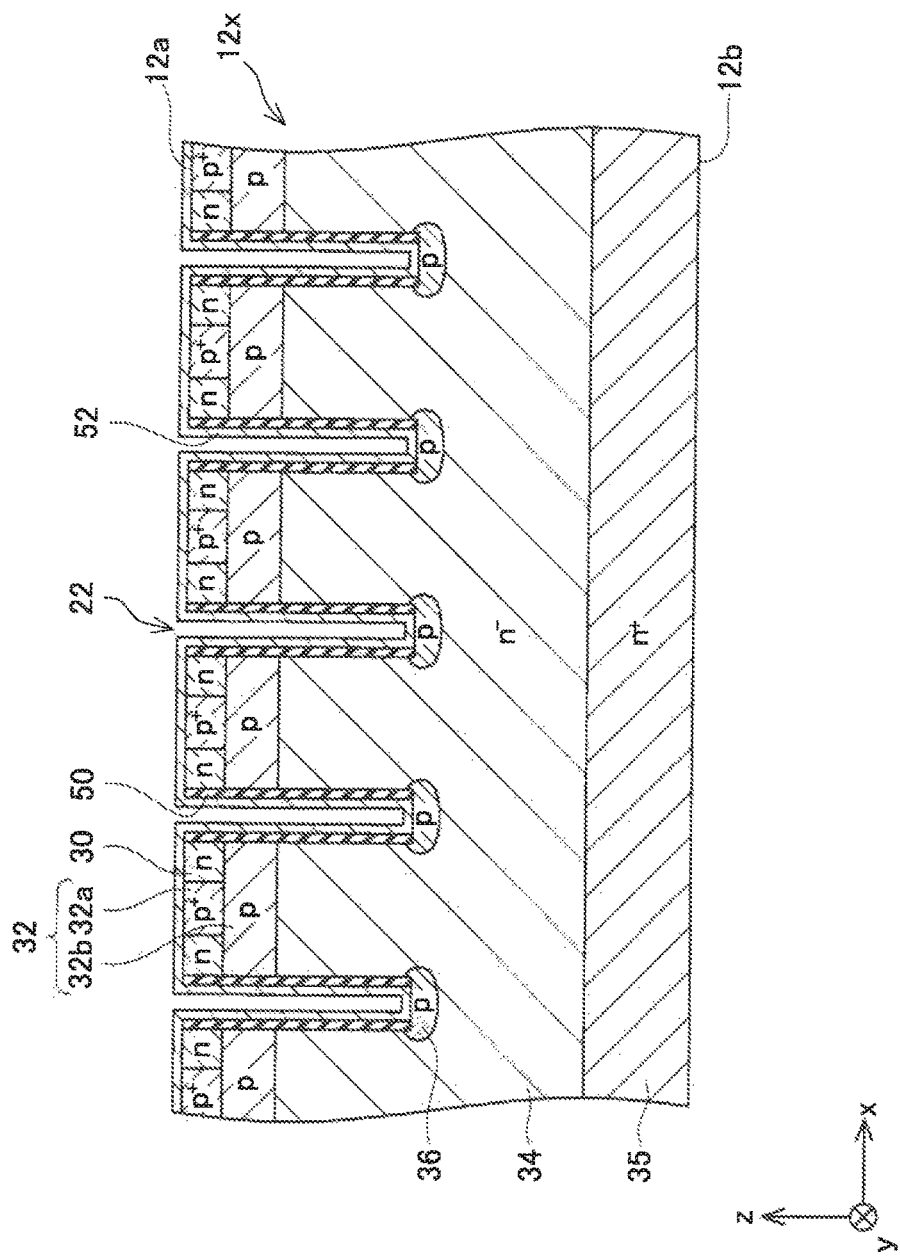
FIG. 9 is a sectional view of the semiconductor substrate after a metal layer is formed.

Then, as shown in FIG. 9, a metal layer 52 (e.g., a nickel layer) is formed on the upper surface 12a of the semiconductor substrate 12x and on the inner surface of each trench 22 (i.e., the bottom surface of the trench 22 and the surface of the oxide film 50).

Figure 10:
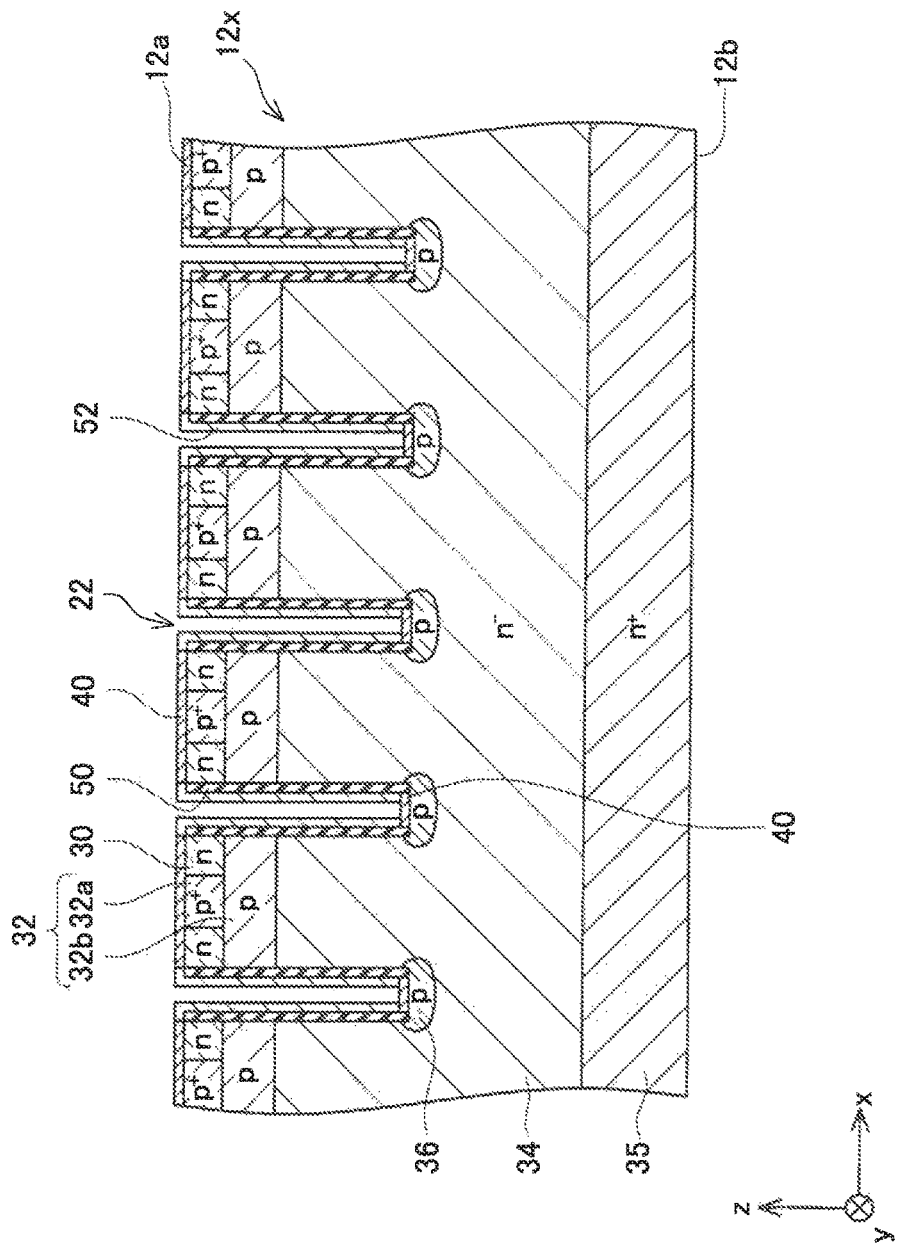
FIG. 10 is a sectional view of the semiconductor substrate after alloying treatment is performed.
Figure 11:
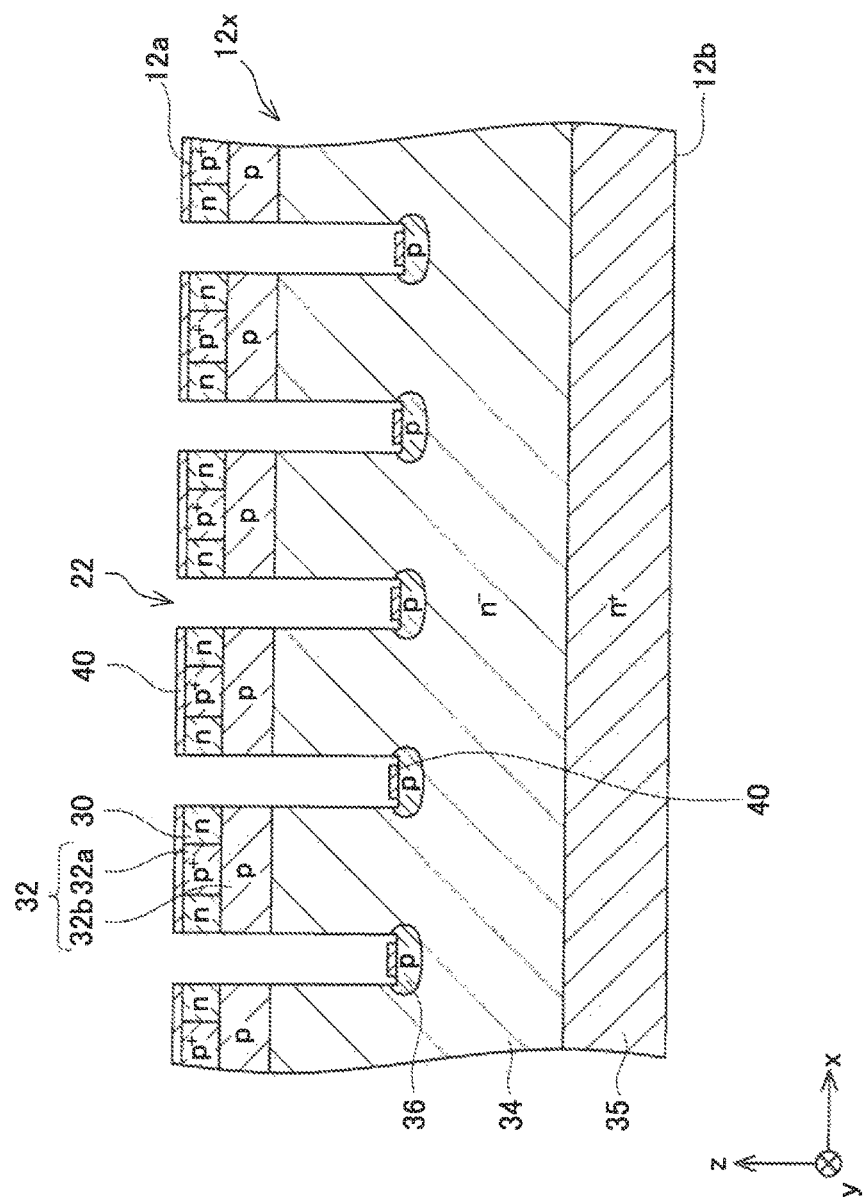
FIG. 11 is a sectional view of the semiconductor substrate after the metal layer and the oxide film are removed.

Then, the semiconductor substrate 12x is heat-treated at approximately 700° C. Since the metal layer 52 and the semiconductor substrate 12x are in direct contact with each other at the bottom surfaces of the trenches 22, the metal layer 52 (i.e., nickel) and silicon in the semiconductor substrate 12x are alloyed with each other (to form silicide). Consequently, as shown in FIG. 10, the conductor layer 40 is formed at the bottom of each trench 22. Also on the upper surface 12a of the semiconductor substrate 12x, the conductor layer 40 is formed by alloying of the metal layer 52. At the side surface of each trench 22, the oxide film 50 is present between the metal layer 52 and the semiconductor substrate 12x, and thus, no alloying reaction occurs. After the conductor layers 40 are formed, as shown in FIG. 11, the metal layer 52 that has not been alloyed is removed by etching (e.g., phosphoric-nitric-acetic acid wet etching). In this case, since the conductor layers 40 are hardly etched, the conductor layers 40 remain. Further, the oxide films 50 are removed by etching (e.g., hydrofluoric acid etching). Thereafter, the semiconductor substrate 12x is heat-treated at approximately 1000° C., thereby promoting the alloying (silicidation) reaction. Consequently, the resistance of the conductor layers 40 is reduced, and the contact resistance of the conductor layers 40 with respect to the bottom semiconductor regions 36 is reduced.

Figure 12:
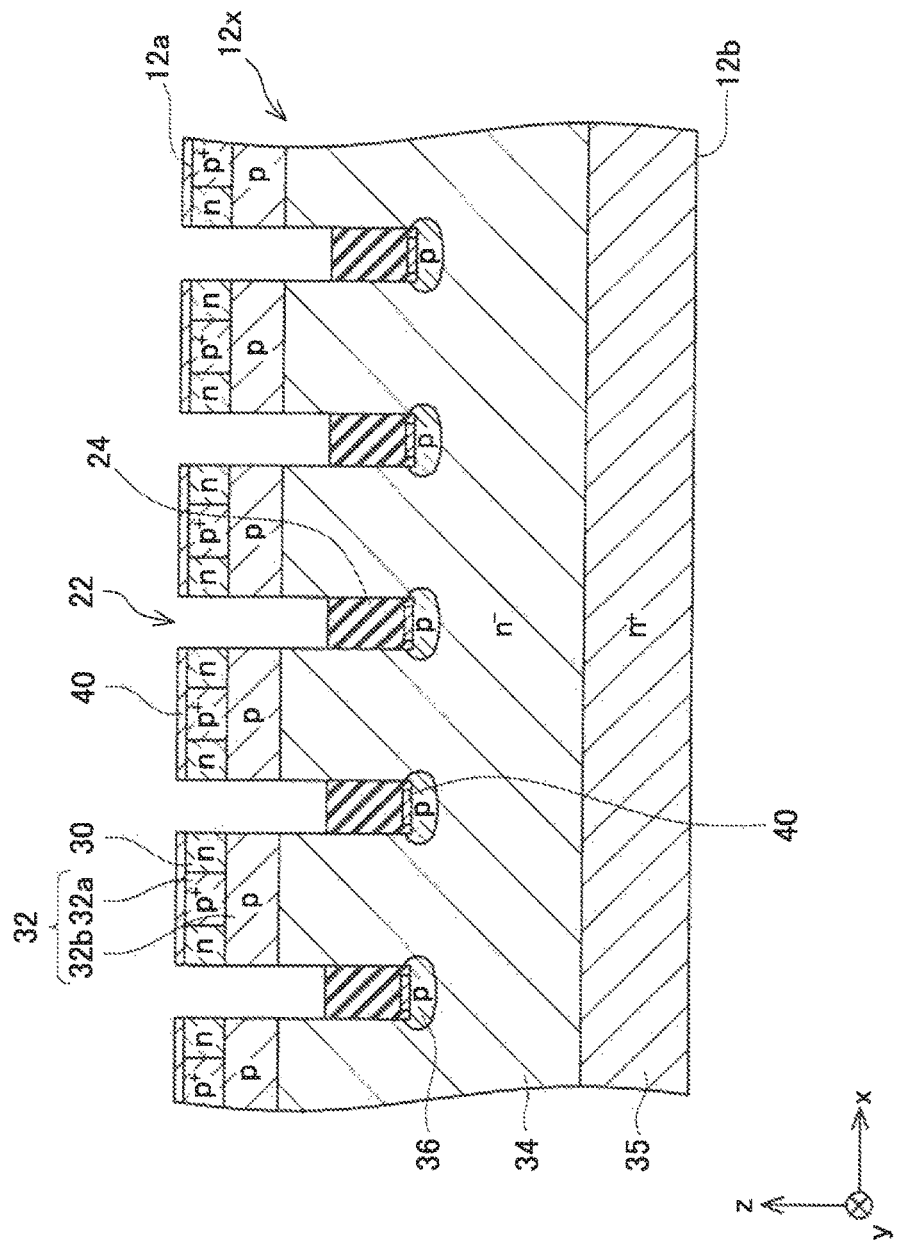
FIG. 12 is a sectional view of the semiconductor substrate after bottom insulating layers are formed.

Then, silicon oxide is embedded in the trenches 22 by low pressure chemical vapor deposition (LP-CVD) or the like, and thereafter, the silicon oxide is etched. Consequently, as shown in FIG. 12, the bottom insulating layers 24 are formed. Thereafter, the gate insulating layers 25, the gate electrodes 26, the interlayer insulating films 28, the upper electrode 70, the lower electrode 72, and so on are formed by conventional well-known methods, and thus, the MOSFET 10 shown in FIGS. 1 to 3 is completed. The conductor layer 40 on the upper surface 12a of the semiconductor substrate 12x may be removed before the upper electrode 70 is formed or may be used as a part of the upper electrode 70.

Figure 13:
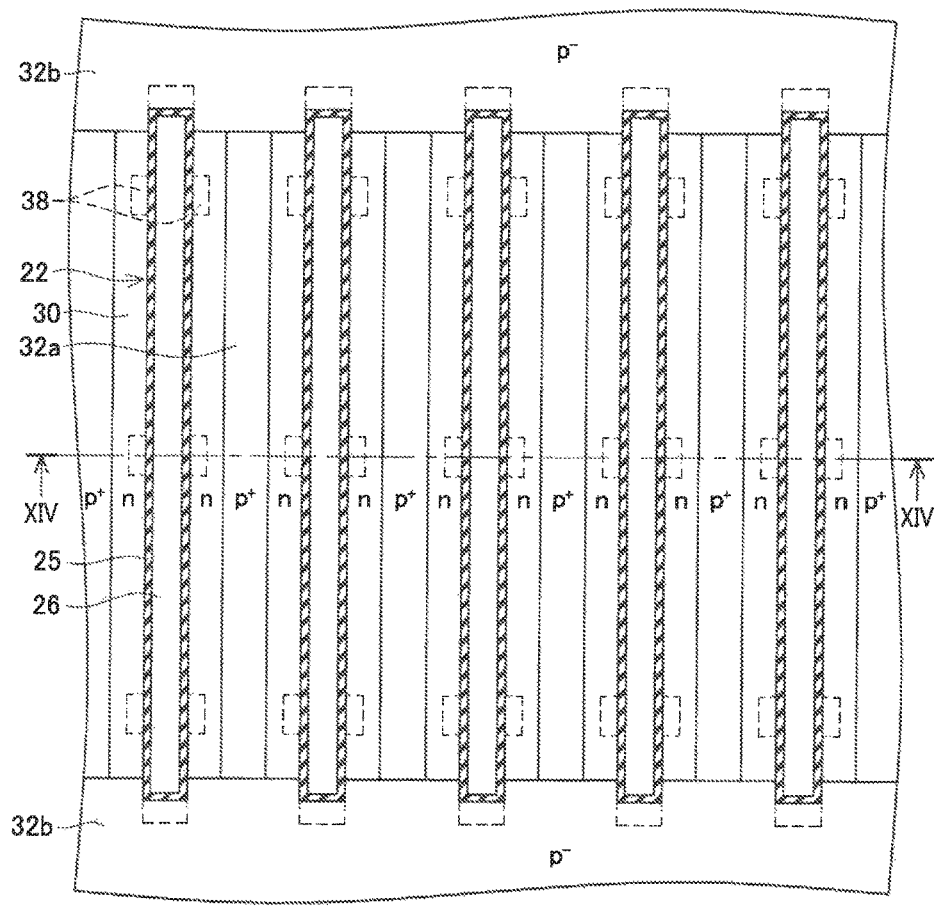
FIG. 13 is a plan view of a MOSFET of an example in which positions of connection semiconductor regions differ from those in the MOSFET of the embodiment.

In the above embodiment, the connection semiconductor regions 38 are provided at the side surfaces of the trenches 22 in the longitudinal direction. However, the connection semiconductor regions 38 may be provided at any portions of the side surfaces of the trenches 22. For example, as shown in FIG. 13, connection semiconductor regions 38 may be provided at portions of the side surfaces of the trenches 22 in the short-side direction. In this case, a section of the trenches 22 at the portions having the connection semiconductor regions 38 has a configuration shown in FIG. 14. Even in this configuration, since the flow of holes in the longitudinal direction of each trench 22 is promoted by the conductor layer 40, the same effect as in the above embodiment is obtained. It is to be noted, however, that since main current of a MOSFET does not flow at a position where the connection semiconductor region 38 is formed, the number of the connection semiconductor regions 38 is preferably as small as possible. On the other hand, in order to supply holes to the entire bottom semiconductor region 36 in a shorter time, it is preferable to arrange the connection semiconductor regions 38 in a more distributed manner. In order to optimize the number and arrangement of the connection semiconductor regions 38, the connection semiconductor regions 38 may be disposed at both ends in the longitudinal direction of each trench 22 and the conductor layer 40 may be provided to extend to positions in the vicinity of the both ends as described in the above embodiment (FIG. 1).

In the above embodiment, nickel silicide is used as the material of the conductor layer 40. However, titanium silicide, titanium carbide, aluminum silicide, aluminum carbide, or the like may be used as a material of the conductor layer 40. A compound containing, as a main component, iron (Fe) or copper (Cu) that is reactive with SiC may be used as a material of the conductor layer 40. In order to prevent metal contamination of a channel portion due to the conductor layer 40, the thickness of the bottom insulating layer 24 is preferably as large as possible. The thickness of the bottom insulating layer 24 is preferably 100 nm or more, and more preferably 500 nm or more. The bottom insulating layer 24 may be made of an insulator (e.g., aluminum oxide ($Al_2O_3$)) other than silicon oxide.

While the n-channel MOSFET has been described in the above embodiment, the technique disclosed in this specification may be applied also to a p-channel MOSFET. The p-channel MOSFET can be formed by replacing the n-type regions in the above embodiment with the p-type regions and replacing the p-type regions in the above embodiment with the n-type regions.

In the above embodiment, the conductor layer 40 is provided in substantially the entire area of the bottom surface of the trench 22 in the longitudinal direction of the trench 22. However, the conductor layer 40 may be provided only at a part of the bottom surface of the trench 22 in the longitudinal direction of the trench 22. Even in this configuration, holes are allowed to move easily in the longitudinal direction of the trench 22 by the conductor layer 40 at the bottom surface of the trench 22, and thus, it is possible to supply the holes to the entire bottom semiconductor region 36 in a short time.

The source region 30 in the embodiment is an example of a "first semiconductor region" according to the disclosure. The drift region 34 in the embodiment is an example of a "second semiconductor region" according to the disclosure. The oxide film 50 in the embodiment is an example of a "protective film" according to the disclosure.

Technical elements disclosed in this specification are listed below. The following technical elements are useful independently of each other.

In the configuration disclosed in this specification by way of example, the connection semiconductor region includes a first part extending along the side surface at one end of the trench in the longitudinal direction thereof, and a second part extending along the side surface at another end of the trench in the longitudinal direction thereof.

With this configuration, charges are supplied to the bottom semiconductor region from both ends of the trench, and thus, the resistance of the drift region around the bottom semiconductor region is reduced more quickly.

While specific examples of the disclosure have been described in detail, these are for illustrative purposes only and thus do not limit the scope of the disclosure. Various modifications and changes may be made to the specific examples described above without departing from the scope of the disclosure. The technical elements described in this specification or in the drawings exhibit technical utility alone or in various combinations and are not limited to the combinations recited in the specific examples described above. The technique described in this specification or in the drawings achieves a plurality of objects simultaneously and has technical utility by achieving any one of the objects.

What is claimed is:

1. A switching device comprising:
    a semiconductor substrate;
    a trench provided in an upper surface of the semiconductor substrate;
    a conductor layer extending in a longitudinal direction of the trench so as to be in contact with a bottom surface of the trench;
    a bottom insulating layer covering an upper surface of the conductor layer;
    a gate insulating layer covering a side surface of the trench above the bottom insulating layer; and
    a gate electrode disposed in the trench and insulated from the semiconductor substrate and the conductor layer by the bottom insulating layer and the gate insulating layer,
    wherein the semiconductor substrate includes
        a first semiconductor region of a first conductivity type contacting the gate insulating layer,
        a body region of a second conductivity type contacting the gate insulating layer under the first semiconductor region,
        a second semiconductor region of the first conductivity type contacting the gate insulating layer under the body region and separated from the first semiconductor region by the body region,
        a bottom semiconductor region of the second conductivity type extending in the longitudinal direction of the trench so as to be in contact with the conductor layer and contacting the second semiconductor region, and
        a connection semiconductor region of the second conductivity type extending along a part of the side surface of the trench and connected to the body region and to the bottom semiconductor region.

2. The switching device according to claim 1, wherein the connection semiconductor region includes a first part extending along the side surface at one end of the trench in the longitudinal direction of the trench, and a second part extending along the side surface at another end of the trench in the longitudinal direction of the trench.

3. The switching device according to claim 1, wherein the conductor layer is provided in substantially an entire area of the bottom surface of the trench in the longitudinal direction of the trench.

4. A manufacturing method comprising:

forming a trench in an upper surface of a semiconductor substrate;

forming a protective film covering a side surface of the trench such that a bottom surface of the trench is exposed;

forming a metal layer covering the protective film and the bottom surface of the trench;

heating the metal layer to form a conductor layer by alloying the metal layer and the bottom surface of the trench with each other;

removing, by etching, the metal layer covering the protective film such that the conductor layer remains; and completing a switching device using the conductor layer and the trench, wherein the switching device includes a bottom insulating layer covering an upper surface of the conductor layer, a gate insulating layer covering the side surface of the trench above the bottom insulating layer, a gate electrode disposed in the trench and insulated from the semiconductor substrate and the conductor layer by the bottom insulating layer and the gate insulating layer, a first semiconductor region of a first conductivity type contacting the gate insulating layer, a body region of a second conductivity type contacting the gate insulating layer under the first semiconductor region, a second semiconductor region of the first conductivity type contacting the gate insulating layer under the body region and separated from the first semiconductor region by the body region, a bottom semiconductor region of the second conductivity type extending in a longitudinal direction of the trench so as to be in contact with the conductor layer and contacting the second semiconductor region, and a connection semiconductor region of the second conductivity type extending along a part of the side surface of the trench and connected to the body region and to the bottom semiconductor region.

* * * * *